(12) United States Patent
Miyazaki

(10) Patent No.: US 6,720,650 B2
(45) Date of Patent: Apr. 13, 2004

(54) SEMICONDUCTOR DEVICE HAVING HEAT SPREADER ATTACHED THERETO AND METHOD OF MANUFACTURING THE SAME

(75) Inventor: Takashi Miyazaki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/905,141

(22) Filed: Jul. 13, 2001

(65) Prior Publication Data

US 2002/0008316 A1 Jan. 24, 2002

(30) Foreign Application Priority Data

Jul. 13, 2000 (JP) .................................... 2000-213224

(51) Int. Cl.[7] .............................................. H01L 23/34
(52) U.S. Cl. .................... 257/707; 257/701; 257/675; 257/717; 257/796
(58) Field of Search .................. 257/701–707, 257/675, 710, 717–720, 722, 778, 787, 796

(56) References Cited

U.S. PATENT DOCUMENTS

| | | | | |
|---|---|---|---|---|
| 4,687,879 A | * | 8/1987 | Hendricks | 136/212 |
| 4,882,298 A | * | 11/1989 | Moeller et al. | 29/832 |
| 5,550,408 A | * | 8/1996 | Kunitomo et al. | 257/737 |
| 5,667,884 A | * | 9/1997 | Bolger | 428/323 |
| 5,672,548 A | * | 9/1997 | Culnane et al. | 438/118 |
| 5,710,071 A | * | 1/1998 | Beddingfield et al. | 438/108 |
| 5,737,191 A | * | 4/1998 | Horiuchi et al. | 361/764 |
| 5,835,355 A | * | 11/1998 | Dordi | 361/760 |
| 5,969,426 A | * | 10/1999 | Baba et al. | 257/778 |
| 5,998,241 A | * | 12/1999 | Niwa | 438/122 |
| 6,069,023 A | * | 5/2000 | Bernier et al. | 438/107 |
| 6,160,714 A | * | 12/2000 | Green | 361/761 |
| 6,347,037 B2 | * | 2/2002 | Iijima et al. | 361/704 |

FOREIGN PATENT DOCUMENTS

| | | | | |
|---|---|---|---|---|
| JP | 04058551 A | * | 2/1992 | |
| JP | 08-241940 | | 9/1996 | |
| JP | 09-008186 | | 1/1997 | |
| JP | 11126856 A | * | 5/1999 | |
| JP | 11214596 A | * | 8/1999 | |

* cited by examiner

Primary Examiner—George Eckert
Assistant Examiner—Chris C. Chu
(74) Attorney, Agent, or Firm—Scully, Scott, Murphy & Presser

(57) ABSTRACT

In a semiconductor device having a heat spreader attached thereto, a semiconductor chip is mounted on a multi-layer wiring substrate via an electrode pad and an insulating resin. The sides of the semiconductor chip on the substrate are sealed with the insulating resin, and a copper paste film contacted to the exposed surface of the semiconductor chips are formed. The copper paste film functions as a heat spreader.

16 Claims, 7 Drawing Sheets

SEMICONDUCTOR DEVICE HAVING HEAT SPREADER ATTACHED THERETO AND METHOD OF MANUFACTURING THE SAME

BACKGROUND OF THE INVENTION

1. Technical Field of the Invention

The present invention relates to a semiconductor device in which a semiconductor chip such as a chip size package or a flip chip is provided with a heat spreader for radiation of heat and the method of manufacturing the same.

2. Description of the Related Art

In recent years, in the multimedia society, accompanying with rapid increment of an information amount and development of an electronic equipment, high integration and high-speed of an electronic component are proceeded and at the same time, miniaturization of a semiconductor device is proceeded, and then miniaturization of a chip size package (hereinafter, referred as CSP) which has the nearly same size as a semiconductor chip and a flip chip (hereinafter, referred as FC) is proceeded.

However, according to high densification of a semiconductor device in recent years, heat generation in the operation becomes increased, thereby, in order to suppress the generation of heat of the semiconductor device, an essential improvement such as decrease of an operating voltage and design for decreasing a current loss is required. At the same time, a counterplan has been performed in which a fan is provided to forcibly cool the semiconductor device or a heat spreader for radiation of heat and a radiating fin are provided.

FIGS. 1A to 1D show methods for providing a heat spreader in a conventional FC in the process sequence.

First, as shown in FIG. 1A, a FC product 100 is fixed to a predetermined position on a working table 101.

Then, as shown in FIG. 1B, an Ag paste 103 stored in a syringe 102 is dropped and applied to the FC product 100 by a predetermined amount. At this time, according to the shape of the heat spreader to be mounted later, the position for applying the Ag paste 103 and the number of the applications (dropping) become different.

Then, as shown in FIG. 1C, the FC product 100 applied with the Ag paste 103 is mounted to a thermal bonding tool 104 of a thermal bonding apparatus. Also, a heat spreader 106 or a heat spreader attached with a support ring is mounted on a heat table 105. The heat spreader 106 is made of aluminum, copper or alloy thereof.

Subsequently, as shown in FIG. 1D, the FC product 100 is tightly pressed to the heat spreader 106 heated by the heat table 105 by the thermal bonding tool 104, the Ag paste 103 is heated and pressed to be cured, and the FC product 100 and the heat spreader 106 are heated and compressed. Thereby, the heat spreader 106 composed of aluminum, copper, or alloy thereof is attached to the FC product 100.

However, since the difference of thermal expansive coefficient between the heat spreader 106 and the semiconductor chip (the FC product 100) is large, a stress generated between the heat spreader 106 and the semiconductor chip can be relaxed in order to directly attach the heat spreader 106 composed of aluminum, copper, or alloy thereof with an excellent heat radiation property to the semiconductor chip, and moreover, an adhesive which has a heat resistance, an electrolytic corrosion resistance and a moisture proof and has less deterioration in case that the moisture proof test is performed under the strict condition such as, particularly, the PCT (Press Cooker Test) process is required. However, a liquid adhesive has a problem that attention to the preservation stability of the adhesive must be paid and a problem that the operating efficiency is deteriorated in comparison with a LOC (Lead On Chip). Also, since a silver paste has a problem that a silver filler is precipitated, there is a problem that dispersion of the silver filler is not uniformed.

Also, as problems related to the process, in case the thermal bonding method, since the semiconductor chip and the heat spreader are bonded with large load of several tens kg, the thermal boding tool 104 often gives damages to the semiconductor chip. Particularly, in case that the thermal bonding tool 104 is contacted to a solder resist layer of the semiconductor chip surface, there is a problem that stripping of the solder resist layer is easily occurred.

Also, in case that the support ring is connected to the heat spreader, since the area of the support ring is large, the time for the thermal bond is needed, and then there is a difficulty that the index time for the process is long. And, since the Ag paste is used, there is a defect that the cost is expensive.

SUMMARY OF THE INVENTION

Thus, the object of the present invention is to provide a method of manufacturing a semiconductor device which is not subjected to restriction by a stress due to the difference of thermal expansive coefficient between a heat spreader and a semiconductor chip, does not need to consider preservation stability of an adhesive and an uniform dispersion of a filler, does not need a thermal bonding tool to avoid damages of the semiconductor chip due to that, and accomplishes the quickness of the process time.

A semiconductor device having a heat spreader attached thereto according to a first aspect of the present invention comprises a substrate; a semiconductor chip mounted on the substrate; an insulating resin layer for sealing the side of the semiconductor chip on said substrate; and a copper paste film contacted to the exposed surface of the surface of said semiconductor chip, wherein said copper paste film functions as a heat spreader.

A semiconductor device having a heat spreader attached thereto according to a second aspect of the present invention comprises a semiconductor chip; and a copper paste film formed to be contacted to the surface of the semiconductor chip, on which a wiring is not formed. Said copper paste film is cut and separated at the same time when said semiconductor chips are individually divided from a semiconductor wafer. Said copper paste film functions as a heat spreader.

In the semiconductor device having a heat spreader attached thereto of the first and the second aspects of the present invention, said copper paste film is formed by applying a copper paste, or said copper paste film is supplied as a copper paste film coated on a sheet base material.

Also, said copper paste film has irregularities on the surface to which said semiconductor chip is not contacted, to extend the radiation area.

A method of manufacturing a semiconductor device having a heat spreader attached thereto according to a third aspect of the present invention comprises the steps of mounting a plurality of semiconductor chips on a substrate; sealing said substrate between said semiconductor chips with an insulating resin; and forming a copper paste film as a heat spreader on the exposed surface of said semiconductor chip and on said insulating resin.

A method of manufacturing a semiconductor device having a heat spreader attached thereto according to a fourth aspect of the present invention comprises the steps of forming a copper paste film as a heat spreader on the surface of said semiconductor wafer, on which a wiring layer is not formed, said semiconductor wafer having said wiring layer on other surface and a semiconductor element; and dividing said semiconductor wafer into a plurality of individual chips, thereby, at the same time, separating said copper paste film into individual copper films on the semiconductor chips.

In the method of manufacturing a semiconductor device having a heat spreader attached thereto of the third aspect of the present invention, said substrate is a multi-layer wiring substrate and a gap between said semiconductor chip and said multi-layer wiring substrate is sealed with the insulating resin in said step of mounting the semiconductor chips. Also, the steps of sealing said substrate between said semiconductor chips with the insulating resin includes supplying the insulating resin to a gap between said semiconductor chips by using capillary phenomenon, supplying the insulating resin by injection, or supplying the insulating resin by transfer. Also, the steps of curing said copper paste film so as to be solidified after said copper paste film is formed, and individually dividing said semiconductor chips together with said copper paste film are provided.

Also, in the third and fourth aspects of the present invention, in the step of forming said copper paste film, said copper paste film can be supplied by dropping and applying of the copper paste or in the step of forming said copper paste film, said copper paste film can be supplied by the copper paste applied on the sheet base material.

In the present invention, the heat spreader has the copper paste film formed on to be contacted to the semiconductor chip. The copper paste film is inexpensive in the material cost, the process thereof is easy, and heat radiation property of the semiconductor chip can be improved by the low cost. Also, the copper paste film is not precipitated as like the Ag filler, and the treatment is easy.

Also, in the present invention, since the copper paste film itself on the semiconductor chip functions as a heat spreader, the heat spreader of different component needs not be compressed by using the thermal bonding tool on the semiconductor chip, damages of the semiconductor chip in the thermal bonding process can be avoided, and at the same time, the processing time can be reduced.

BRIEF DESCRIPTION OF THE DRAWINGS

The above objects, other objects, features and advantages of the present invention will be better understood from the following description taken in conjunction with the accompanying drawings, in which.

DETAILED DESCRIPTION OF THE PREFERRED EMBODIMENTS

Hereinafter, a semiconductor device having a heat spreader attached thereto and the method of manufacturing the same according to the embodiments of the present invention will be explained with reference to the accompanying drawings.

FIGS. 2A to 2E are cross-sectional views showing a method of manufacturing a semiconductor device having a heat spreader attached thereto according to a first embodiment of the present invention in the process sequence.

Figure 1A:
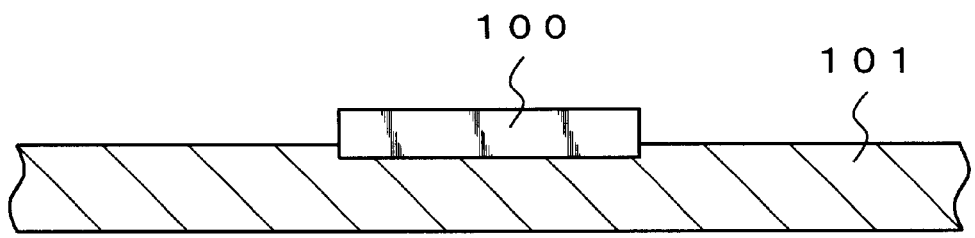
FIGS. 1A to 1D are cross-sectional views showing a conventional method of manufacturing a semiconductor device having a heat spreader attached thereto in the process sequence.
Figure 1B:
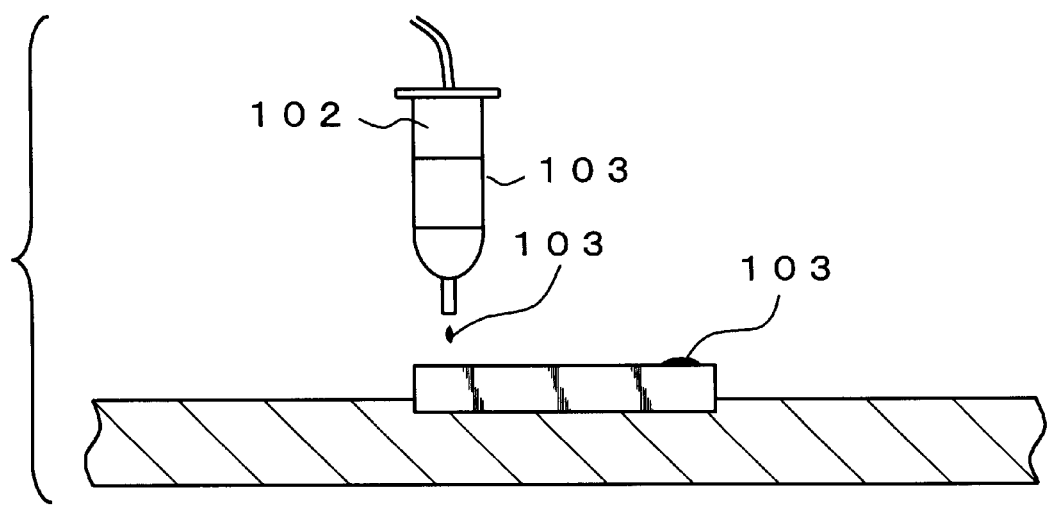
Figure 1C:
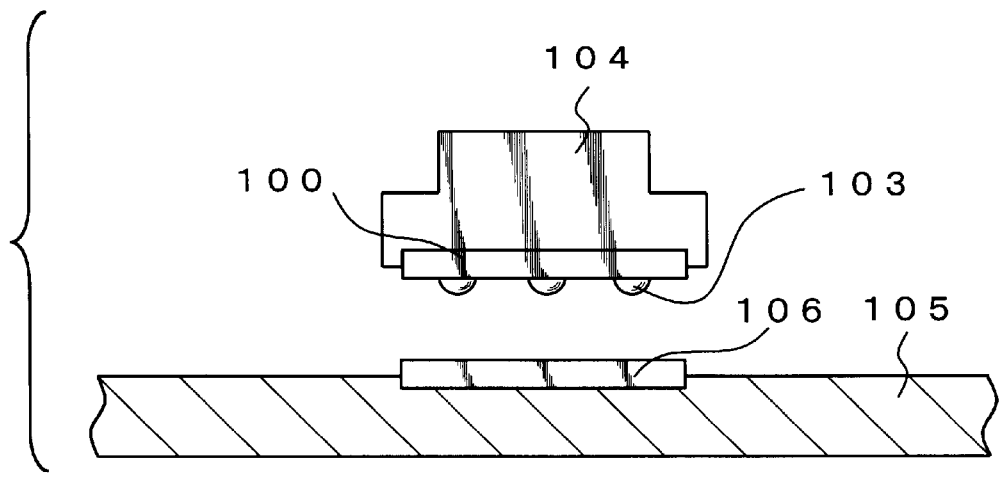
Figure 1D:
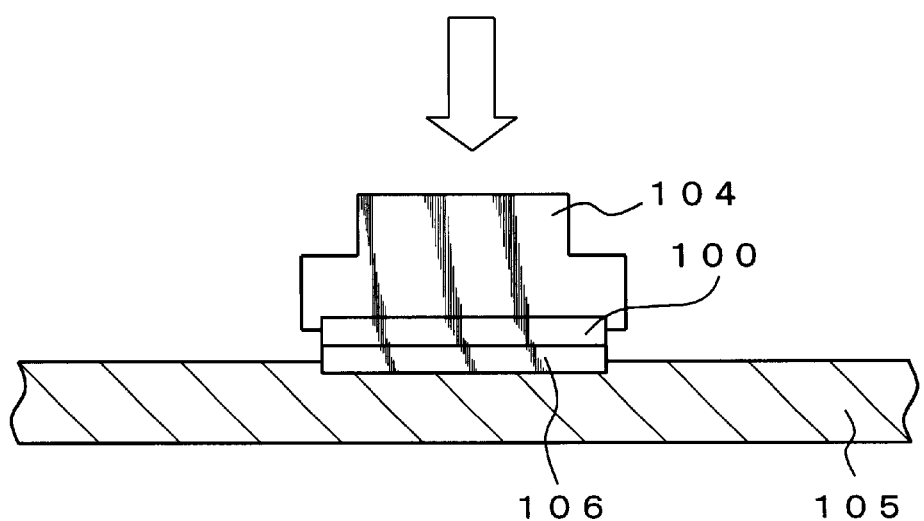
Figure 2A:
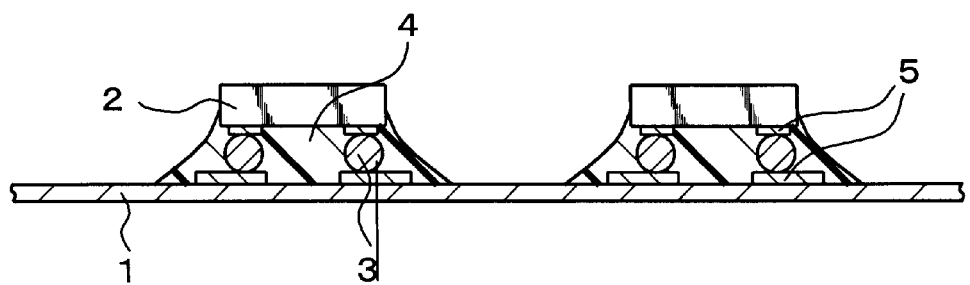
FIGS. 2A to 2E are cross-sectional views showing a method of manufacturing a semiconductor device having a heat spreader attached thereto according to a first embodiment of the present invention in the process sequence.

First, as shown in FIG. 2A, in BGA (Ball Grid Array) or FC (Flip Chip) type semiconductor device product, a semiconductor chip 2 is disposed on a ceramic substrate, a tape substrate such as polyimide, or a multi-layer wiring substrate 1 composed of the material such as plastic in a predetermined gap, an electrode pad 5 formed on the surface of the multi-layer wiring substrate 1 and an electrode pad 5 formed on the lower surface of the semiconductor chip 2 are electrically conducted via electric conductive material such as a solder ball 3. The semiconductor chip 2 is disposed on the multi-layer wiring substrate 1 in a line or a matrix shape, and the gap between the semiconductor chip 2 and the multi-layer wiring substrate 1 is sealed with an insulating stress relaxation resin or an insulating resin 4. In this case, the insulating stress relaxation resin or the insulating resin 4 is disposed by using the capillary phenomenon as like an underfill resin. For example, wiring layer of the multi-layer wiring substrate 1 is formed with the material such as Cu, Al, Ag, Au, or, Sn.

The insulating resin or the insulating stress relaxation resin 4 interposed between the semiconductor chip 2 and the multi-layer wiring substrate 1 is formed with any one of epoxy-based resin, silicon-based resin, polyimide-based resin, polyolefin-based resin, cyanate ester-based resin, phenol-based resin, naphthalene-based resin, or fluorine-based resin as a main component.

Also, a conductive metal such as a solder, Au, Ag, Cu or a conductive resin such as an anisotropic conductive film (ACF) may be interposed between the semiconductor chip 2 and the multi-layer wiring substrate 1 to conduct the both electrically.

Figure 2B:
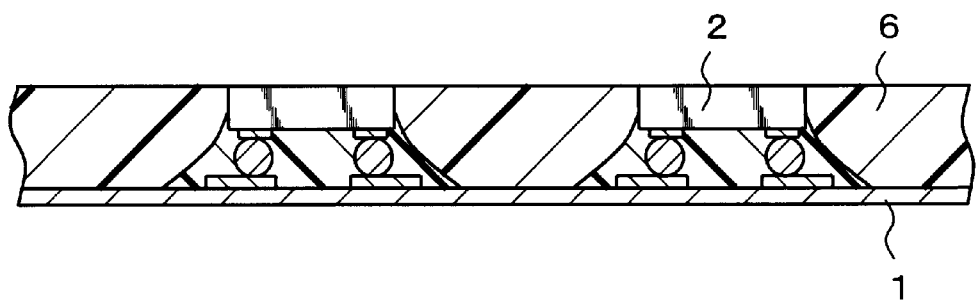

Next, as shown in FIG. 2B, an insulating resin 6 is filled and disposed between the semiconductor chips 2, and all the semiconductor chips 2 on the multi-layer wiring substrate 1 are sealed at a time. In this case, the insulating resin 6 can be disposed by using a resin injecting technique such as an injection sealing technique or a transfer sealing technique. Also, the upper surface of the semiconductor chip 2 is exposed and not covered with the insulating resin 6.

The sealing by the insulating resin 6 is accomplished in order to protect the chip from the mechanical or chemical stress or the outside environment or to make coating of a copper paste film in a subsequent process to easy. When the insulating resin is filled in the gap between the semiconductor chips is sealed at a time, a concrete filling method of the insulating resin or the insulating stress relaxation resin can use various resin injection techniques such as a disposing method using the capillary phenomenon as like an underfill resin, a method by the injection sealing technique, or a method by the transfer sealing technique, etc.

The insulating resin 6 disposed between the semiconductor chips can use any one of the epoxy-based resin, the silicon-based resin, the polyimide-based resin, the polyolefin-based resin, the cyanate ester-based resin, the phenol-based resin, the naphthalene-based resin, or the fluorene-based resin as a main component.

Figure 2C:
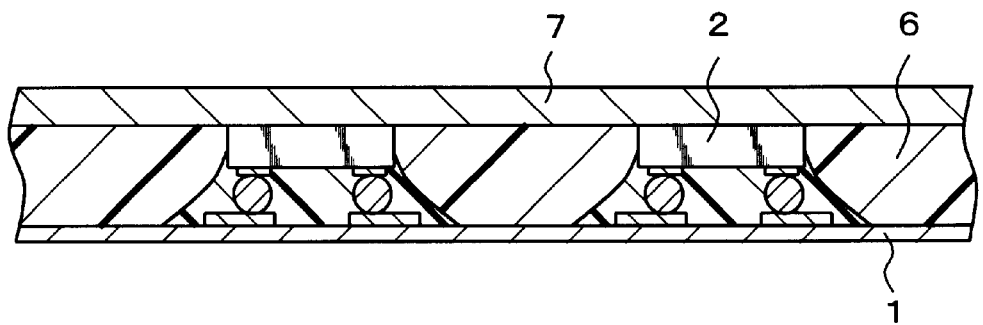

Then, as shown in FIG. 2C, a copper (Cu) paste film 7 is applied on the exposed surface of the semiconductor chip 2 and on the surface of the insulating resin 6 filling the gap between the semiconductor chips 2. As an applying method of the copper paste film 7, there is an application by a screen-printing method, a patterning application, or a spin coating method, etc. Particularly, in the screen printing application and the patterning application, since the shape of the paste film 7 can be somewhat freely designed, the paste film shape having large surface area of the radiating surface and the paste film shape corresponding to the state of the applied surface can be formed.

Figure 2D:
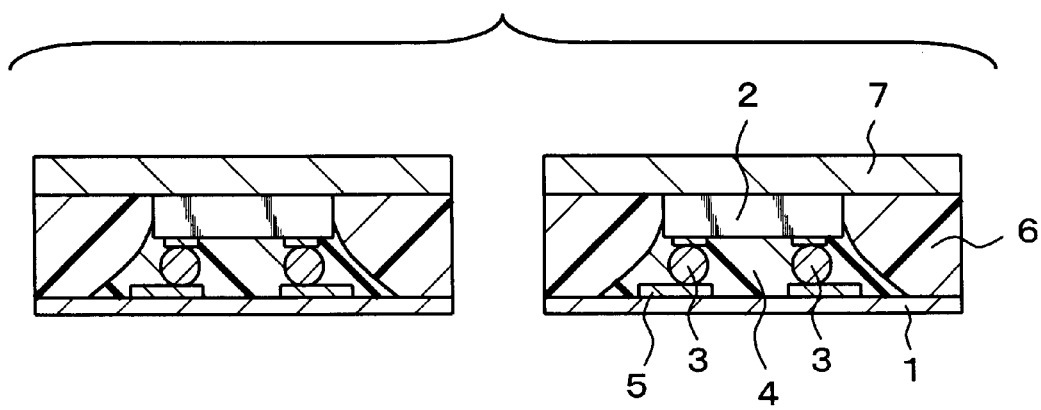

Next, as shown in FIG. 2D, after the Cu paste film 7 is cured and the copper paste film 7 is solidified, the base material for fixing the chip is separated to individually divide to each of semiconductor chips 2. Thereby, a heat spreader composed of the copper paste film and a semiconductor device having the copper paste film heat spreader attached thereto is obtained.

Figure 2E:
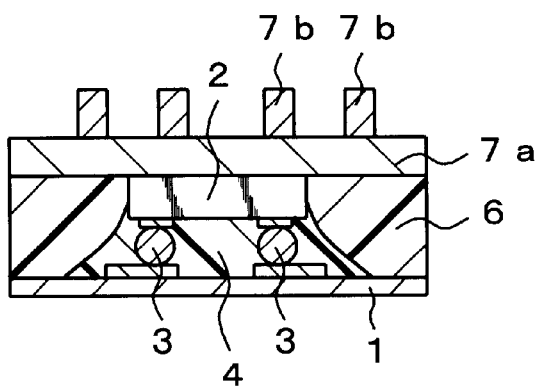

Also, as shown in FIG. 2E, when the Cu paste film 7 is formed in the process of FIG. 2C, a convex portion 7b is formed on the surface of a base portion 7a to be equally applied to enlarge the copper paste film surface area composed of the base portion 7a and the convex portion 7b, thereby heat radiation property of the heat spreader can be all the more improved.

In the semiconductor device of the present embodiment composed as mentioned above, since the Cu paste film 7, the copper paste film base portion 7a and the convex portion 7b can be cured to be solidified in a baking furnace at a time, reduction of the index time of the process can be accomplished. Also, in the above-mentioned present embodiment, since the Cu paste film 7 (7a) as a heat spreader is formed on the plurality of the chips 2 at a time, and the semiconductor chips 2 are individually divided last, reduction of the process time and reduction of the manufacturing cost can be accomplished.

In the above-mentioned heat spreader, since the paste type material is cured to become a heat spreader, the thermal expansion difference between the semiconductor chip and the heat spreader such as aluminum plate or copper plate does not need to be considered as like the prior art. Also, the general heat spreader must be manufactured according to the size of the package, but, as the present embodiment, in case that the spreader is the paste type Cu paste film 7 (the base portion 7a and the convex portion 7b), since the heat spreader can be freely manufactured in accordance with the size, the material can be unified.

As like the prior art, in case of the thermal bonding method between the solids which stick the copper plate and the chip, in order to join the both, a large load must be applied between the both. Thereby, mechanical damages to the chip are generated, but, as the present embodiment, mechanical damages to the chip are remarkably reduced by forming the heat spreader using the Cu paste film 7 and the copper paste film (the base portion 7a, the convex portion 7b).

Next, the second embodiment of the present invention will be explained concretely with reference to FIGS. 3A to 3G. FIGS. 3A to 3G are cross-sectional views showing a method of manufacturing a semiconductor device having a heat spreader attached thereto according to the second embodiment of the present invention in the process sequence.

Figure 3A:
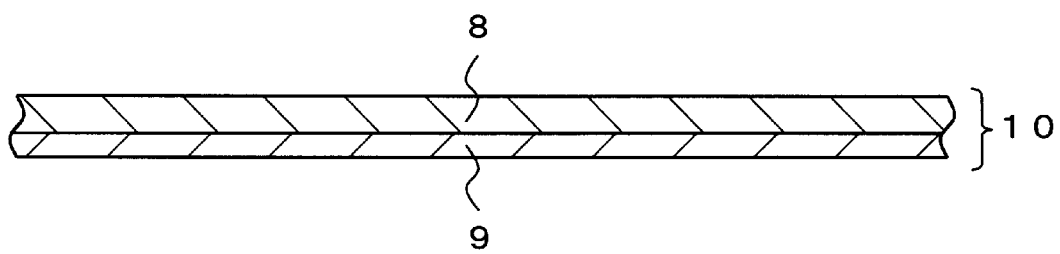
FIGS. 3A to 3G are cross-sectional views showing a method of manufacturing a semiconductor device having a heat spreader attached thereto according to a second embodiment of the present invention in the process sequence.

The second embodiment is to apply the present invention to a method of manufacturing a flip chip type semiconductor device. First, as shown in FIG. 3A, a copper paste sheet 10 which a semisolid Cu paste film 8 is uniformly applied to a sheet base material 9 for applying the paste is prepared in advance. The copper paste sheet 10 can be purchased as a member, and, by using the copper paste sheet 10, the treatment of the copper paste film 8 becomes easy.

Figure 3B:
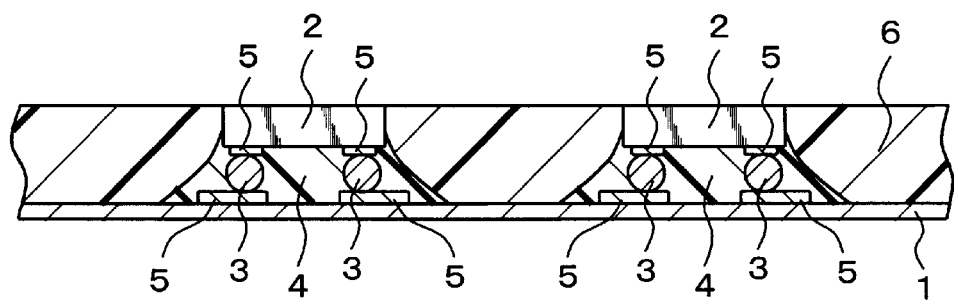

Next, as shown in FIG. 3B, similar to the first embodiment, a semiconductor chip 2 which is disposed on a multi-layer wiring substrate 1 in a line or a matrix shape, and the gap between the semiconductor chip 2 and the multi-layer wiring substrate 1 which is sealed with an insulting stress relaxation resin or an insulating resin 4 are prepared.

Figure 3C:
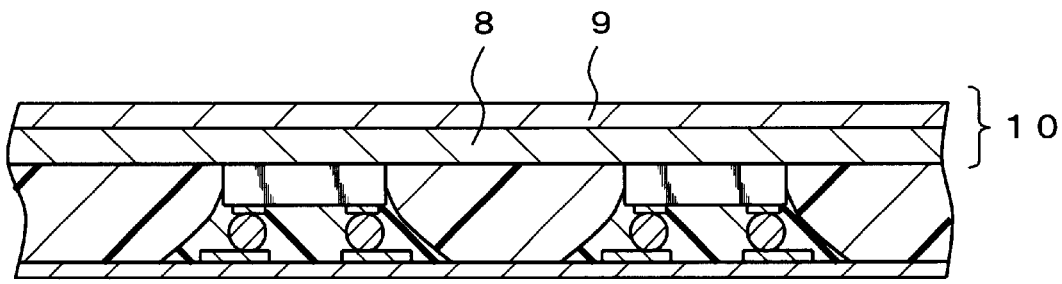

Subsequently, as shown in FIG. 3C, the surface of an insulating resin 6 and the surface of the side of semiconductor chip 2 in FIG. 3B are attached to the Cu paste film 8 of the paste sheet 10 in FIG. 3A, and the Cu paste film 8 is cured. Thereby, the Cu paste film 8 is solidified. In this case, when the paste film is the semisolid paste, the attachment by the thermal bond is needed, but, since the curing process is simultaneously performed, the curing process is reduced.

Figure 3D:
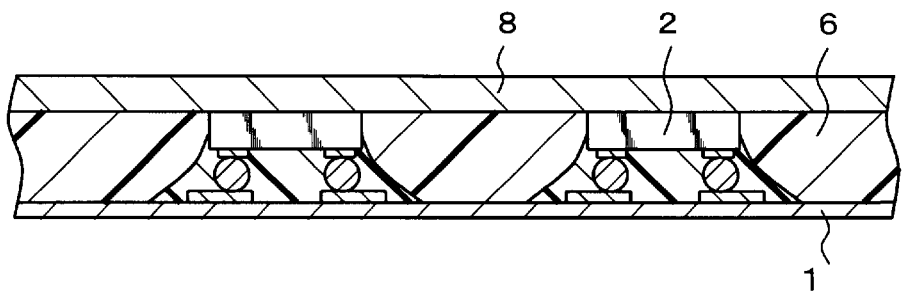

Next, as shown in FIG. 3D, the sheet base material 9 for applying the paste is stripped from the Cu paste film 8.

Figure 3E:
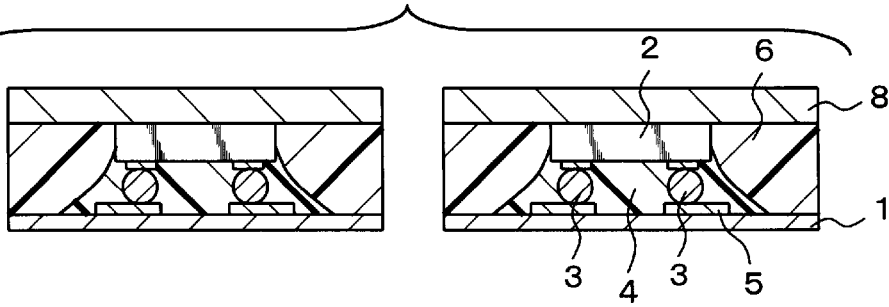

Then, as shown in FIG. 3E, by performing the individual-dividing process, the heat spreader and the semiconductor chip attached with the heat spreader can be obtained.

By using material and process of the second embodiment, the heat spreader by the Cu paste film of which the film thickness of the Cu paste film 8 is all the more uniformed can be formed, and reduction of the process sequence can be accomplished by using the paste sheet as a member.

In the present embodiment, similar to FIG. 2E, by providing the irregularities to the surface of the Cu paste film 8 to enlarge the surface area, the radiation property of the heat spreader can be all the more improved.

Figure 3F:
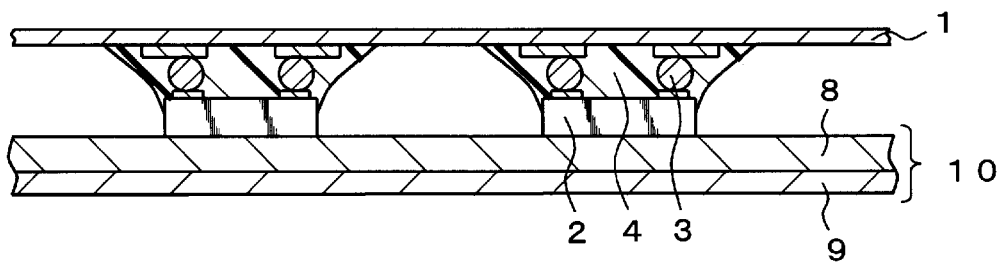
Figure 3G:
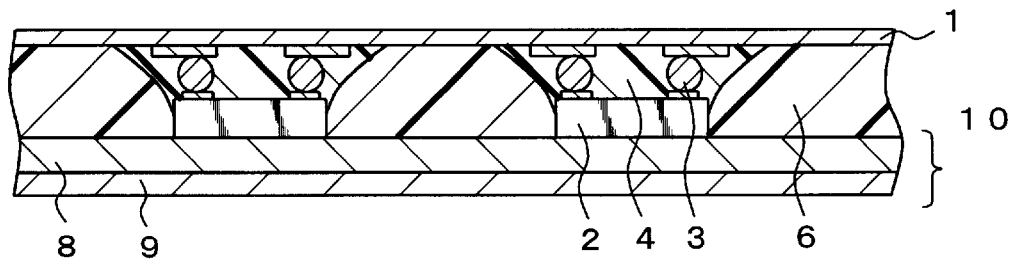

Also, the method may be performed that the Cu paste film is used as a sheet for forming the insulating resin, as shown in FIG. 3F, in the second embodiment, the Cu paste sheet 10 is not disposed on the insulating resin 6 (refer to FIG. 3C), but the Cu paste sheet 10 is disposed on the semiconductor chip 2 on the multi-layer wiring substrate 1 before the insulating resin 6 is formed, and then, as shown in FIG. 3G, the insulating resin 6 can be disposed in the inside. Thereby, cure of the Cu paste film and the insulating resin can be performed at a time, and reduction of the process can be accomplished.

Figure 4A:
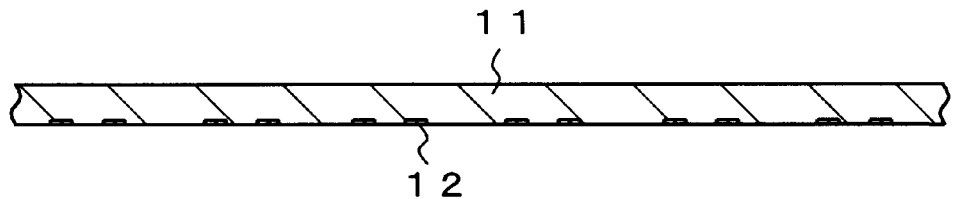
FIGS. 4A to 4D are cross-sectional views showing a method of manufacturing a semiconductor device having a heat spreader attached thereto according to a third embodiment of the present invention in the process sequence.

Next, the third embodiment of the present invention will be explained. FIGS. 4A to 4D are cross views showing a method of manufacturing a semiconductor device having a heat spreader attached thereto according to the third embodiment of the present invention in the process sequence. As shown in FIG. 4A, a semiconductor wafer 11 on which a wiring layer (not shown) is formed is prepared. The semiconductor wafer 11 is formed with an electrode pad 12 connected to the wiring layer.

Figure 4B:
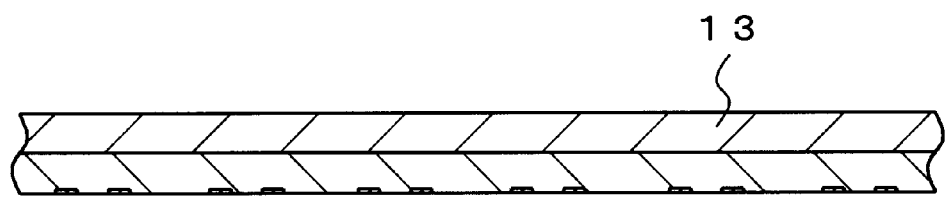

Next, as shown in FIG. 4B, a Cu paste film 13 is applied to the rear surface on which the wiring layer (the electrode pad 12) of the semiconductor wafer 11 is not formed. As the method for applying the Cu paste film 13, the whole surface application by a screen printing method, a patterning application, an application by a spin coating method can be used, and the paste sheet 10 shown in FIG. 3A of the second embodiment can be supplied.

Figure 4C:
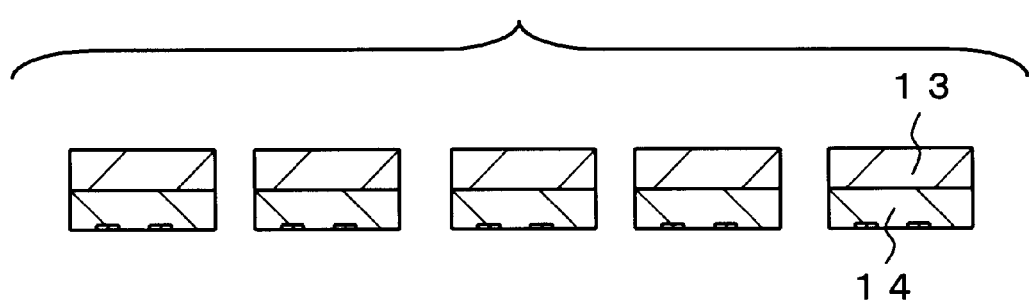

Then, after the Cu paste film 13 is cured to be solidified, as shown in FIG. 4C, the individual-dividing process is performed to divide the wafer into a plurality of individual semiconductor chips, thereby the product which the copper paste film 13 is formed on a semiconductor chip 14 can be obtained.

Figure 4D:
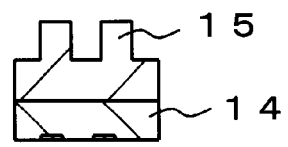

Also, in this case, as shown in FIG. 4D, by using the Cu paste film 13 with protrusions 15, the radiating area can be increased to improve the radiating effect. Thereby the Cu paste film 13 can become all the more improved as a heat spreader.

In the semiconductor device according to the above-mentioned third embodiment, since a heat spreader is formed in the wafer level and the individual-dividing process of chips is performed by dicing only after the heat spreader is formed, the dicing before the heat spreader is formed is not needed, thereby reduction of the process can be accomplished.

Although the technical spirits of the present invention has been disclosed with reference to the appended drawings and the preferred embodiments of the present invention corresponding to the drawings, the descriptions in the present specification are only for illustrative purpose, not for limiting the present invention.

Also, those who are skilled in the art will appreciate that various modifications, additions and substitutions are possible without departing from the scope and spirit of the present invention. Therefore, it should be understood that the present invention is limited only to the accompanying claims and the equivalents thereof, and includes the aforementioned modifications, additions and substitutions.

What is claimed is:

1. A semiconductor device having a heat spreader attached thereto, comprising:

a semiconductor chip; and a copper paste film contacting a surface on which a wiring is not formed on said semiconductor chip, said copper paste film including a base portion in contact with a semiconductor wafer and individual alternately spaced portions which protrude from the base portion away from the semiconductor wafer, wherein said copper paste film functions as a heat spreader for spreading heat over a heat spread area; and an insulating resin for sealing the semiconductor chip on a substrate.

2. The semiconductor device having a heat spreader attached thereto according to claim 1, wherein said copper paste film is formed by applying a copper paste.

3. The semiconductor device having a heat spreader attached thereto according to claim 1, wherein said copper paste film is supplied as a copper paste film formed on a base sheet material.

4. The semiconductor device having a heat spreader attached thereto according to claim 1, wherein said copper paste film has irregularities on a surface which is not in contact with said semiconductor chip, to extend the heat spread area.

5. A semiconductor device having a heat spreader attached thereto, comprising:

a substrate;

a semiconductor chip mounted on the substrate;

an insulating resin layer for sealing a side of the semiconductor chip on said substrate; and a copper paste film contacted to an exposed surface of said semiconductor chip, wherein said copper paste film functions as a heat spreader for spreading heat over a heat spread area and said copper paste film has irregularities on a surface which is not in contact with said semiconductor chip, to extend the heat spread area.

6. The semiconductor device having a heat spreader attached thereto according to claim 5, wherein said copper paste film is formed by applying a copper paste.

7. The semiconductor device having a heat spreader attached thereto according to claim 5, wherein said copper paste film is supplied as a copper paste film formed on a base sheet material.

8. A method of manufacturing a semiconductor device having a heat spreader attached thereto, comprising the steps of:

mounting a plurality of semiconductor chips on a substrate;

sealing said substrate between said semiconductor chips with an insulating resin; and forming a copper paste film as a heat spreader for spreading heat over a heat spread area on an exposed surface of said semiconductor chips and on said insulating resin, said copper paste film having irregularities on a surface which is not in contact with said semiconductor chip, to extend the heat spread area.

9. A method of manufacturing a semiconductor device having a heat spreader attached thereto according to claim 8, wherein said substrate is a multi-layer wiring substrate, and a gap between said semiconductor chip and said multi-layer wiring substrate is sealed with the insulating resin in said step of mounting the semiconductor chips.

10. A method of manufacturing a semiconductor device having a heat spreader attached thereto according to claim 9, wherein the step of sealing said substrate between said semiconductor chips with the insulating resin includes supplying the insulating resin to a gap between said semiconductor chips by using capillary phenomenon, supplying the insulating resin by injection, or supplying the insulating resin by transfer.

11. A method of manufacturing a semiconductor device having a heat spreader attached thereto according to claim 8, further comprising a step of curing said copper paste film so as to be solidified after said copper paste film is formed, and a step of dividing said wafer into individual said semiconductor chips together with said copper paste film.

12. A method of manufacturing a semiconductor device having a heat spreader attached thereto according to claim 8, wherein in the step of forming said copper paste film, said copper paste film is supplied by applying the copper paste.

13. A method of manufacturing a semiconductor device having a heat spreader attached thereto according to claim 8, wherein in the step of forming said copper paste film, said copper paste film is supplied by the copper paste film coated on the sheet base material.

14. A method of manufacturing a semiconductor device having a heat spreader attached thereto, comprising the steps of:

forming a copper paste film as a heat spreader for spreading heat over a heat spread area on a surface of a semiconductor wafer, on which a wiring layer is not formed, said wafer having said wiring layer on an other surface thereof and a semiconductor element; and dividing said semiconductor wafer into a plurality of individual semiconductor chips, thereby, separating said copper paste film into individual copper paste films on the semiconductor chips so that said copper paste films include a base portion in contact with a semiconductor wafer and individual alternately spaced portions which protrude from said base portion away from said semiconductor wafer.

15. A method of manufacturing a semiconductor device having a heat spreader attached thereto according to claim 14, wherein in the step of forming said copper paste film, said copper paste film is supplied by applying the copper paste.

16. A method of manufacturing a semiconductor device having a heat spreader attached thereto according to claim 14, wherein in the step of forming said copper paste film, said copper paste film is supplied by the copper paste film coated on the sheet base material.

* * * * *